United States Patent
Tong et al.

(10) Patent No.: US 11,764,804 B2
(45) Date of Patent: Sep. 19, 2023

(54) ADAPTIVE SUBBAND COMPRESSION OF STREAMING DATA FOR POWER SYSTEM MONITORING AND CONTROL

(71) Applicant: CORNELL UNIVERSITY, Ithaca, NY (US)

(72) Inventors: Lang Tong, Ithaca, NY (US); Xinyi Wang, Ithaca, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 0 days.

(21) Appl. No.: 18/011,516

(22) PCT Filed: Jun. 22, 2021

(86) PCT No.: PCT/US2021/038543
§ 371 (c)(1),
(2) Date: Dec. 19, 2022

(87) PCT Pub. No.: WO2021/262760
PCT Pub. Date: Dec. 30, 2021

(65) Prior Publication Data
US 2023/0188161 A1    Jun. 15, 2023

Related U.S. Application Data

(60) Provisional application No. 63/042,444, filed on Jun. 22, 2020.

(51) Int. Cl.
*H03M 7/00* (2006.01)
*H03M 7/30* (2006.01)
*H02J 13/00* (2006.01)

(52) U.S. Cl.
CPC ......... *H03M 7/30* (2013.01); *H02J 13/00002* (2020.01)

(58) Field of Classification Search
CPC ........................... H03M 7/30; H02J 13/00002
(Continued)

(56) References Cited

U.S. PATENT DOCUMENTS

| 6,686,857 B2 | 2/2004 | LoCasale et al. |
| 2006/0259255 A1 | 11/2006 | Anderson et al. |

(Continued)

OTHER PUBLICATIONS

International Searching Authority (WO/ISA), International Search Report and Written Opinion issued in PCT/US2021/038543, dated Oct. 1, 2021.

*Primary Examiner* — Jean B Jeanglaude
(74) *Attorney, Agent, or Firm* — FisherBroyles, LLP; Gregory T. Fettig

(57) ABSTRACT

Systems and methods herein provide for adaptive subband compression of power signals in a power system. In one embodiment, a system includes an encoder is operable to partition sensor measurements into frequency subbands (e.g., including an interharmonic subband), centered at integer multiples of the power system's fundamental frequency (e.g., 50 Hz or 60 Hz). The encoder may also be operable to detect active subbands, and to compress the at least one active subband. The system also includes a data concentrator operable to transmit the at least one compressed subband to a processor for analysis. The system also includes a decoder at a processing location (a substation, a concentrator, or the control center) operable to parse the compressed waveforms into subbands, to interpolate and decompress at least one compressed subband, and to synthesize the decompressed subbands as an approximation of the original waveform (e.g., subject to reconstruction error requirements).

30 Claims, 11 Drawing Sheets

(58) Field of Classification Search
USPC .................................................. 341/50, 51
See application file for complete search history.

(56) References Cited

U.S. PATENT DOCUMENTS

| | | |
|---|---|---|
| 2007/0239440 A1* | 10/2007 | Garudadri ............... G10L 19/08 704/E19.024 |
| 2009/0198500 A1 | 8/2009 | Garudadri et al. |
| 2019/0239099 A1 | 8/2019 | Kong et al. |

* cited by examiner

| CASE NUMBER | MAXIMUM TVE(%) | G-TVE(dB) |
|---|---|---|
| 1 | 0.95 | -59.2382 |
| 2 | 0.76 | -58.7235 |
| 3 | 0.82 | -59.2657 |
| 4 | 0.71 | -60.1384 |
| 5 | 0.81 | -59.2062 |
| 6 | 0.72 | -60.1303 |
| 7 | 0.74 | -59.8744 |
| 8 | 1.08 | -59.3843 |
| 9 | 0.77 | -59.2343 |
| 10 | 0.79 | -59.8777 |

TVE FOR THE EPFL SYNCHROPHASOR DATASET. COMPRESSION RATION IS 50:1. SUBBAND FILTER WITH 1 Hz BANDWIDTH WAS USED

ADAPTIVE SUBBAND COMPRESSION OF STREAMING DATA FOR POWER SYSTEM MONITORING AND CONTROL

CROSS REFERENCE TO RELATED APPLICATIONS

This patent application is a U.S. National Phase filing under 35 U.S.C. § 371 of International Application No. PCT/US2021/038543, filed Jun. 22, 2021, and published as WO 2021/262760 A1 on Dec. 30, 2021, which claims priority to, and thus the benefit of an earlier filing date from, U.S. Provisional Patent Application No. 63/042,444, filed Jun. 22, 2020, the entire contents of which are hereby incorporated by reference.

BACKGROUND

Modern power systems are large complex dynamical systems. A minor event, such as the tripping of a transmission line or the loss of a generator can drive the system along a trajectory that may appear normal for an extended period and then suddenly bifurcate into oscillations, chaotic motions, and abrupt collapses. And, outages are increasingly more common with greater integration of intermittent renewable sources, such as wind and solar power.

Certain machine learning and artificial intelligence techniques are being developed to provide real-time situational awareness by extracting hidden signatures from field sensors such as phasor measurement units (PMUs) and continuous point-on-wave (CPOW) devices and then exploiting structural properties of the underlying physical model of the power system. However, these techniques generally rely on supervisory control and data acquisition (SCADA) and PMU technologies with relatively low frame rates. Based on static or quasi-static phasor models, these techniques are ineffective in detecting activity such as dynamic events and tracking transient behaviors. With greater penetration of inverter-based energy resources such as wind, solar, and electric battery power injections, power system signal waveforms become have more broadband characteristics with higher-order harmonics and are increasingly stochastic. It is increasingly evident that a future wide-area monitoring system (WAMS) needs to include real-time streaming of high-resolution field measurements, including high data rate PMU and CPOW measurements.

SUMMARY

Systems and methods presented herein provide high-fidelity and high-resolution real-time or on-demand streaming of PMU and CPOW data for grid monitoring, control, and analysis via adaptive subband compression. In one embodiment, a front-end filter partitions outputs of a sensor (CPOW, PMU, or SCADA) devices into a plurality of harmonic frequency subbands centered at integer multiples of the fundamental frequency, detects activity in at least one of the digitized subbands, and compresses signals from at least one subband with detected activity. The compressed subband signals are then transmitted through a data network to a processor at, for example, a substation or a control center for monitoring, predictive analysis (e.g., to predict voltage collapses, or "blackouts", in the power system), and control. The processor extracts subband data streams individually from the streaming data carrying the information. Then, each subband data stream is demodulated and decompressed to a close approximation of its original form from field sensor devices before the processor performs inference, learning, predictive analysis, and control tasks.

The various embodiments disclosed herein may be implemented in a variety of ways as a matter of design choice. For example, some embodiments herein are implemented in hardware whereas other embodiments may include processes that are operable to implement and/or operate the hardware. Other exemplary embodiments, including software and firmware, are described below.

BRIEF DESCRIPTION OF THE FIGURES

Some embodiments of the present invention are now described, by way of example only, and with reference to the accompanying drawings. The same reference number represents the same element or the same type of element on all drawings.

DETAILED DESCRIPTION OF THE FIGURES

The figures and the following description illustrate specific exemplary embodiments. It will thus be appreciated that those skilled in the art will be able to devise various arrangements that, although not explicitly described or shown herein, embody certain principles and are included within the scope of the embodiments. Furthermore, any examples described herein are intended to aid in understanding the embodiments and are to be construed as being without limitation to such specifically recited examples and conditions. As a result, the embodiments are not limited to any of the examples described below.

Figure 1:
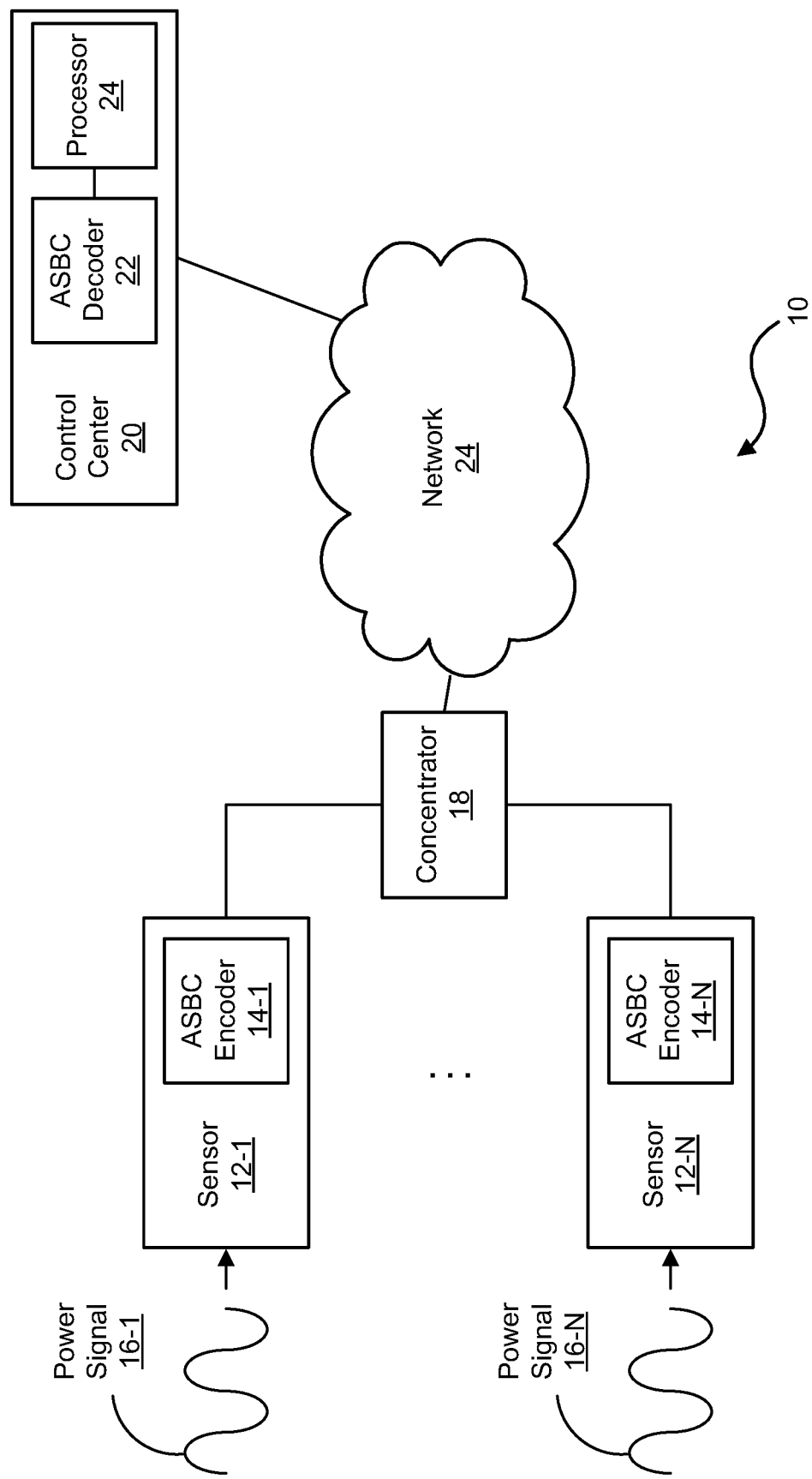
FIG. 1 is a block diagram of an exemplary system 10 for communicating power signal information in a power system.

FIG. 1 is a block diagram of an exemplary system 10 for communicating power signal measurements to a control center of a power system. In this embodiment, a power system has a plurality of sensors 12-1-12-N (where the reference "N" is an integer greater than 1 and not necessarily equal to any other "N" reference is designated herein) configured along power lines of the power system such that each sensor 12 receives a power signal 16 from its respective power line. These sensors can be SCADA, PMU, CPOW, and/or other existing or new intelligent electronic devices. Each sensor 12 is configured with an ASBC encoder 14 that is operable to partition sensor measurements into frequency subbands centered around integer multiples of the fundamental frequency of the power system along with a cross-harmonic subband that covers leakage from harmonic subbands. However, the ASBC encoders 14 may be separate from the sensors 12. For example, the ASBC encoders 14 may be configured with a communication interface that receives digitized subbands from the sensors 12.

The ASBC encoder 14 may then dynamically compress some portion of the digitized band that have certain levels of activity based on the strength of subband signals (e.g., higher energy levels, persistent anomalies, power transients, etc.). These compressed bands may then be communicated to a data concentrator 18 which combines the data streams of each of the sensors 12 into a single stream for transmission to a control center 20 (e.g., or a regional phasor data concentrator where an ASBC decoder 22 may be located) over a communication network 24 (e.g., the Internet or any suitable communication structure). It should be noted that this implementation may be modified for a system where measurements from multiple field sensors are communicated to a substation that processes locally field data.

Once received by the control center 20, the ASBC decoder 22 decodes the data streams of the sensors 12 such that they may be processed by a processor 24 of the control center 20 for a determination as to whether certain power signals 16 may lead to a cascading voltage collapse in the overall power system (e.g., a blackout). If so, the control center 20 may take corrective action to prevent the voltage collapse.

To illustrate how the sensors 12 and the encoders 14 are able to identify activity in certain subbands and compress the data of those subbands for transmission to the control center 20, an analysis of the power signals 16 and the operation of the ASBC encoders 14 are now presented. First, the continuous time voltage (or current) signal x(t) and its associated frequency domain (e.g., a Fourier spectrum) X(f) can be modeled as:

$$x(t) = \sum_{k=1}^{K} x_k(t) + e(t),$$

$$x_k(t) = a_k(t)\cos(k\Omega_0 t + \phi_k(t)),$$

where $x_0(t)$ is the voltage signal associated with the nominal operating frequency $F_0$ (e.g., typically 50 or 60 Hz depending on the country of the power system), $\Omega_0 = 2\pi F_0$, $x_k(t)$ is the distortion associated with the $k^{th}$ harmonic at $kF_0$ in hertz (Hz), and e(t) is the interharmonic. For simplicity, the inter-harmonic subband is not included in the above model.

Figure 2:
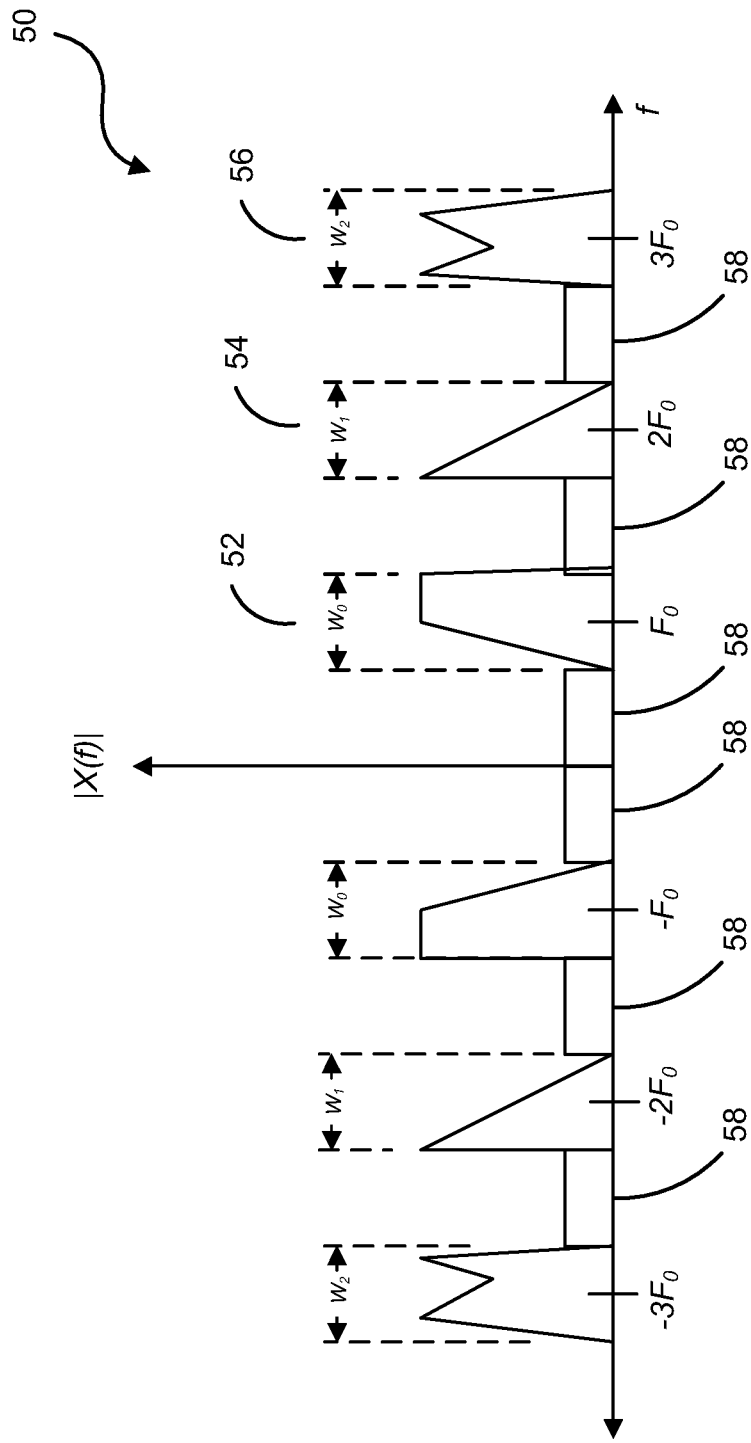
FIG. 2 illustrates an exemplary frequency domain of a power signal of the power system.

An exemplary Fourier spectrum |X(f)| of the signal is shown in FIG. 2. In this example, the fundamental frequency $F_0$ of the phasor of the power signal is illustrated in a subband 52 of frequencies having a bandwidth of $W_0$. The harmonics of the fundamental frequency $F_0$ are illustrated in subbands 54 and 56 centered at frequencies $F_1$ and $F_2$, respectively. The frequency regions 58 represent the spectrum of interharmonics. Thus, assuming that the spectrum |X(f)| of the $k^{th}$ harmonic is centered around (k+1) with a passband bandwidth of $W_k < F_0$, the bandwidth of x(t) is $$KF_0 + \frac{W_K}{2} \leq \left(K + \frac{1}{2}\right)F_0,$$

the passage bandwidth being defined as the width of the frequency band containing nonzero frequency components. The sensor 12 may be operable to sample at the frequency of $$F_s = \frac{1}{T_s}$$

such that the discrete time signal is given by, for n=0, ±1, . . . :

$$x[n] := x(n/F_s) = \sum_{k=1}^{K} x_k[n] + e[n],$$

$$x_k[n] := a_k[n]\cos\left(k\frac{\Omega_0}{F_s}n + \phi_k[n]\right),$$

where $$\omega_0 = \frac{\Omega_0}{F_s},$$

and $a_k[n]$ and $\varphi_k[n]$ are the sampled amplitude and phase angles associated with the $k^{th}$ harmonic, and e[n] is the interharmonic signal. Then $X(\omega) = \Sigma_n x[n]e^{-j\omega n}$ is the discrete time Fourier transform (DTFT) of x[n] Unlike CPOW data, PMU measurements are complex phasors and real frequency measurements that are slowly varying. To incorporate PMU data in the same framework, a slight generalization may be made by modeling the PMU measurement data x[n] as a sampled complex baseband signal x(t) with $\Omega_0$ defined by $x(t) = a_0(t)e^{j\phi_0(t)}$.

Each ASBC encoder 14 extracts subband signals via a filter bank with each sub-filter outputting the signal whose frequency is centered around an integer multiple of the fundamental frequency. The encoder detects the presence of energy in at least one of the frequency subbands. For example, the ASBC encoder 14 may partition the signal spectrum into a set of frequency bands (e.g. channels) and adaptively mask inactive bands. The ASBC encoder 14 may then encode the active (e.g., unmasked) bands separately.

To illustrate, suppose that the field sensor samples the continuous time signal x(t) of the power signal 16 at a rate of $F_s$ Hz. The ASBC encoder 14 may frequency downshift the discrete time signal x[n] and pass the discrete time signal through a filter bank with a transfer function $\mathcal{H} = (\mathcal{H}_e, \mathcal{H}_1, \ldots, \mathcal{H}_K)$, as illustrated in the subband processor 152 of FIG. 3. The output of the filter bank is a (K+1) dimensional complex time series $y[n] = (y_0[n], \ldots, y_k[n])$ and the output of the $k^{th}$ subband filter is given by $$y_k[n] = (x[n]e^{-jk\omega_0 n}) \circledast h_k[n],$$

$$\omega_0 := \frac{2\pi F_0}{F_s},$$

where $\circledast$ is the convolution operator and $h_k[n]$ is the impulse response of the $k^{th}$ subband filter. The signal $y_k[n]$ is a baseband representation of the $k^{th}$ harmonic signal $x_k[n]$ and its continuous time counterpart is $\tilde{x}_k(t)=x_k(t)e^{-jk\Omega_o t}$. The interharmonic distortion $y_e[n]$ of the interharmonics 58 is $$y_e[n] = x[n] - \sqrt{2}\,\mathrm{Re}\!\left(\sum_{k=1}^{K} y_k[n] e^{jh\omega_0 n}\right)\!.$$

And, in absence of higher-order harmonics, $x(t)=x_1(t)$ and $y_1[n]$ is nonzero.

Figure 3:
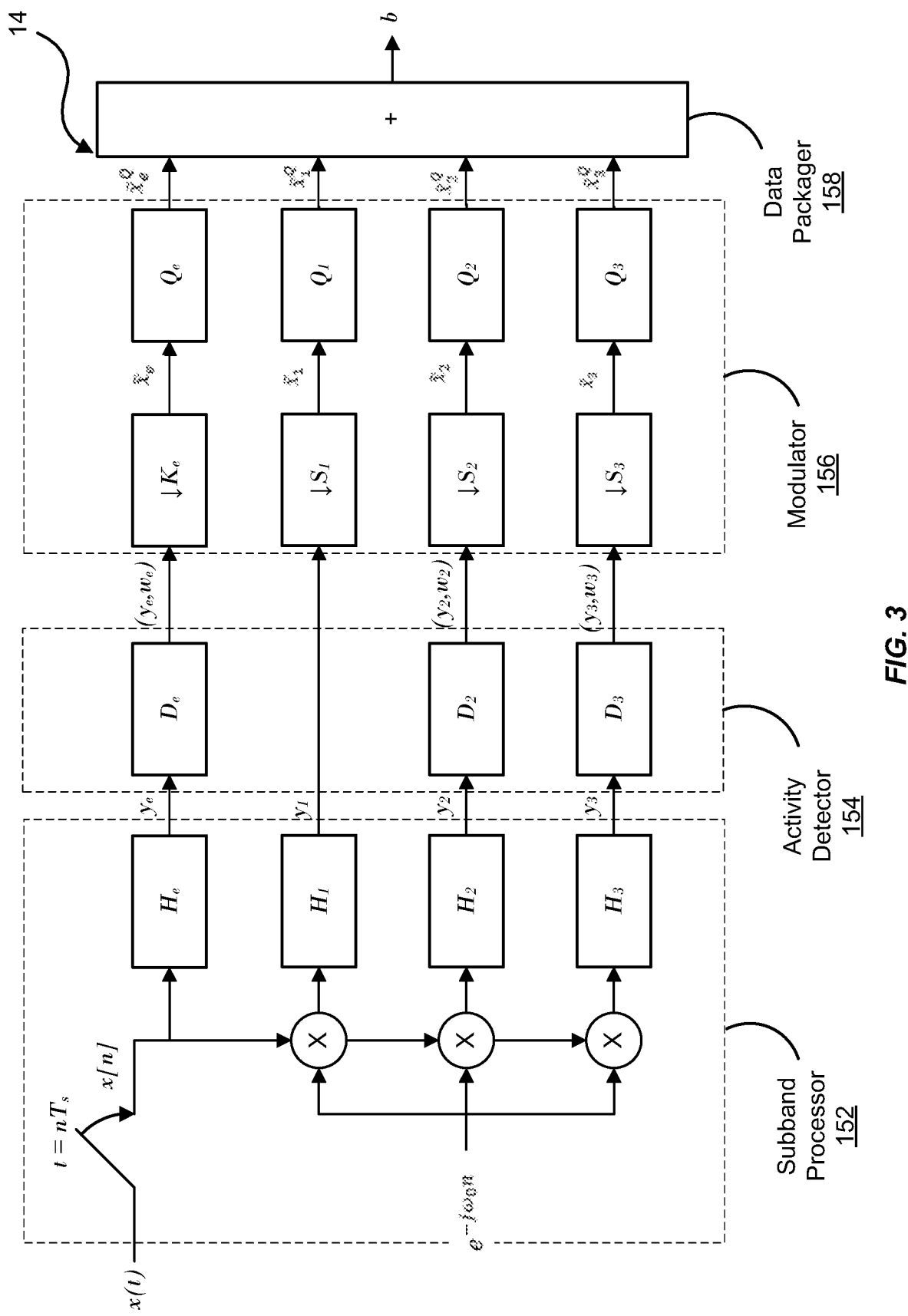
FIG. 3 is a block diagram of an exemplary adaptive subband compression (ASBC) encoder.

The ASBC encoder 14 may detect activity in the subbands via an activity detector 154 of FIG. 3. Except for the signal $y_0[n]$ of the subband filter $H_0$ corresponding to the subband associated with $F_0$, the output $y_k[n]$ of the subband filter $H_k(z)$ is passed through an activity detector $D_k$ (e.g., $D_e$, $D_2$, etc.) to determine a level of compression for the single component associated with the $k^{th}$ harmonic where the data stream is removed from compression, encoded at the full Nyquist rate, or anywhere in between. The detector $D_k$ may be implemented by an energy detector on a block by block basis. Thus, for a block of $M_k$ data points starting at $n-M_k+1$ and ending at n, the empirical power level is:

$$\hat{p}_k[n] = \begin{cases} \frac{1}{M_k}\sum_{m=0}^{M_k-1} |y_k[n-m]|^2, & n \equiv 0(\mathrm{mod}\ M_k) \\ \# & \text{otherwise} \end{cases},$$

where #represents a "no value" that is to be ignored downstream. The detector $D_k$ compares $\hat{p}_k[n]$ with a threshold $\tau$ to produce a masking function for the data block (e.g., to remove certain subbands from transmission when there is little or no activity present) as follows:

$$z_k[n] = \begin{cases} 1 & \text{if } \hat{p}_k[n] \geq \tau_k, n \equiv 0(\mathrm{mod}\ M_k) \\ 0 & \text{if } \hat{p}_k[n] < \tau_k \text{ and } n \equiv 0(\mathrm{mod}\ M_k) \end{cases}$$

$$z_k[n-i] = z_k[n] \text{ for } n \equiv 0(\mathrm{mod}\ M_k), 0 \leq i < M_k.$$

The threshold $\tau_k$ may be chosen to control a false positive rate when there is substantial energy in the $k^{th}$ harmonic while the detector $D_k$ declares otherwise.

After detection, the ASBC encoder 14 may down-sample and quantize the subband signals that comprise activity via a modulator 156 of the ASBC encoder 14. For example, in a subband k, if the detector $D_k$ indicates that the energy level in the data block is high, the outputs of the subband filter $y_k[n]$ and the detector $z_k[n]$ are input to a down sampler that samples $y_k[n]$ for one in every $S_k$ data points. More specifically, given that $x(t)$ is sampled at $F_s$, the rate of down sampling $S_k$ is given by $$S_k = \left\lceil \frac{F_s}{W_k} \right\rceil.$$

If a subband K is active, the down sampler yields the compressed sequence as follows:

$$\hat{x}_k[n] = \begin{cases} y_k[nS_k], & \omega_k[n] = 1, \\ \#, & \text{otherwise,} \end{cases}$$

where "#" represents samples with no value and will not be encoded or transmitted downstream. While $x[n]$ may be defined for all "n", generally only a fraction of $1/S_k$ data samples contain values to be transmitted to the control center 20. Thus, the data rate associated with $x[n]$ is $1/S_k$ of $y_k[n]$.

Each ASBC encoder 14 may then compress the digitized band(s) of frequencies via a combination of the modulator 156 and a data packager 158 to forward the compressed digitized subband(s) to the data concentrator 18 for transmission to the control center 20. For example, the modulator 156 may strip the "no value" data samples "#" such that quantizer elements $Q_k$ (e.g., $Q_1$, $Q_2$, etc.) of the modulator 156 can map $x[n]$ into a bitstream $\hat{x}_k^Q[n]$. A scaler quantizer, such as a pulse code modulation (PCM), differential PCM (DPCM), a Sigma Delta modulation, a vector quantizer, and/or a machine learning-based quantizer, may map $x_k[n]$ when $n=0\ (\mathrm{mod}\ S_k)$ into $B_k$ bits. A vector quantization scheme, such as a code excited linear prediction (CELP) or a K-mean clustering, may map a block of samples to $M_k\,B_k$ bits. The bit streams from the subbands may then be packaged into a single bitstream transmission signal by the data packager 158 for delivery to the control center 20 (e.g., via the data concentrator 18).

Figure 4:
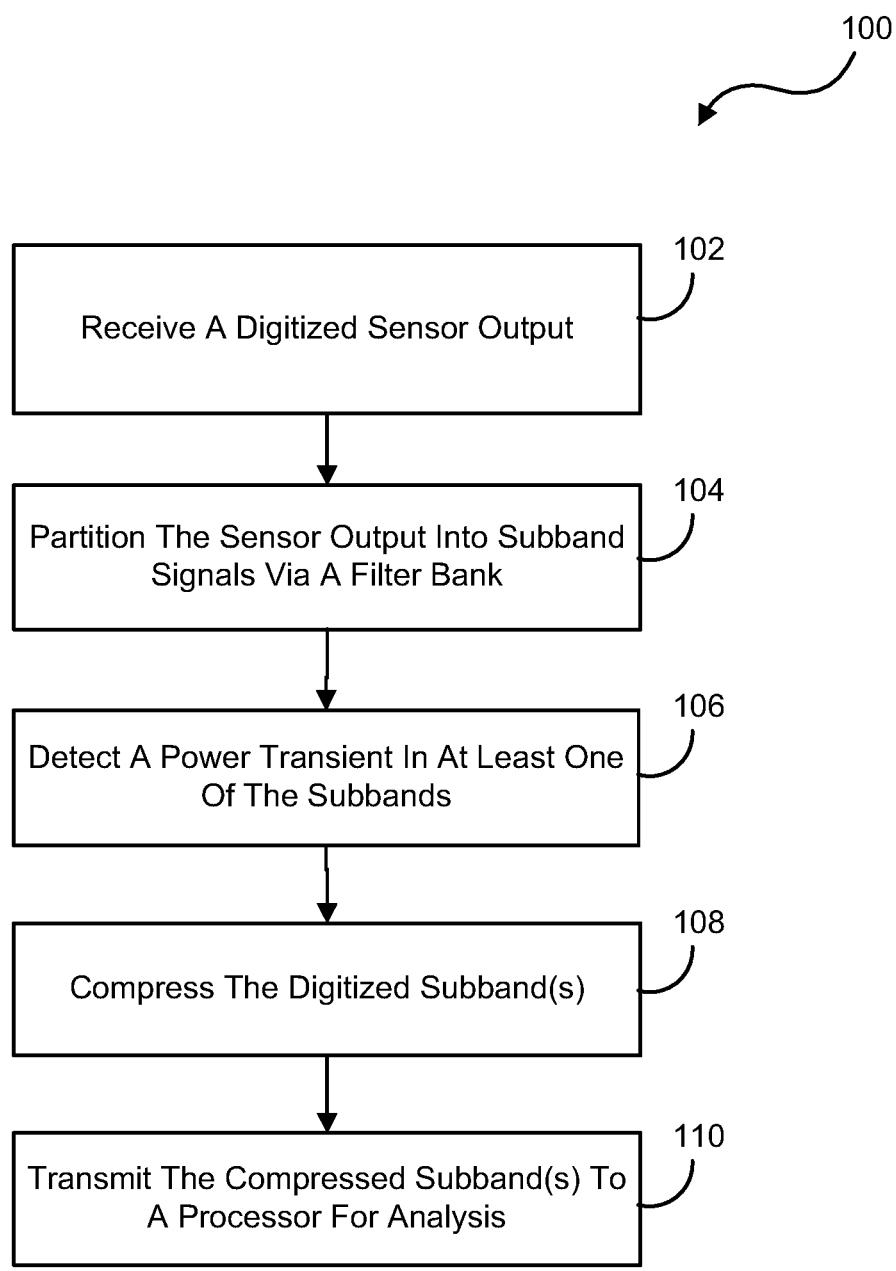
FIG. 4 is a flowchart of an exemplary process of the ASBC encoder.

FIG. 4 is a flowchart of an exemplary process of the ASBC encoder 14. In this embodiment, the ASBC encoder 14 receives a digitized sensor output, in the process element 102, and partitions the sensor output into subband signals via a filter bank, in the process element 104. Each subband signal has its spectrum centered at a multiple of the fundamental frequency. The ASBC encoder 14 then detects activity in at least one of the subbands, in the process element 106. The ASBC encoder 14 may then compress at least one of the subbands (e.g., the subbands comprising activity), in the process element 108. The ASBC encoder 14 then transmits the digitized/compressed subband(s) via the data concentrator 18 to the processor 24 (e.g., of the control center 20 or a regional phasor data concentrator where an ASBC decoder 22 may be located).

Figure 5:
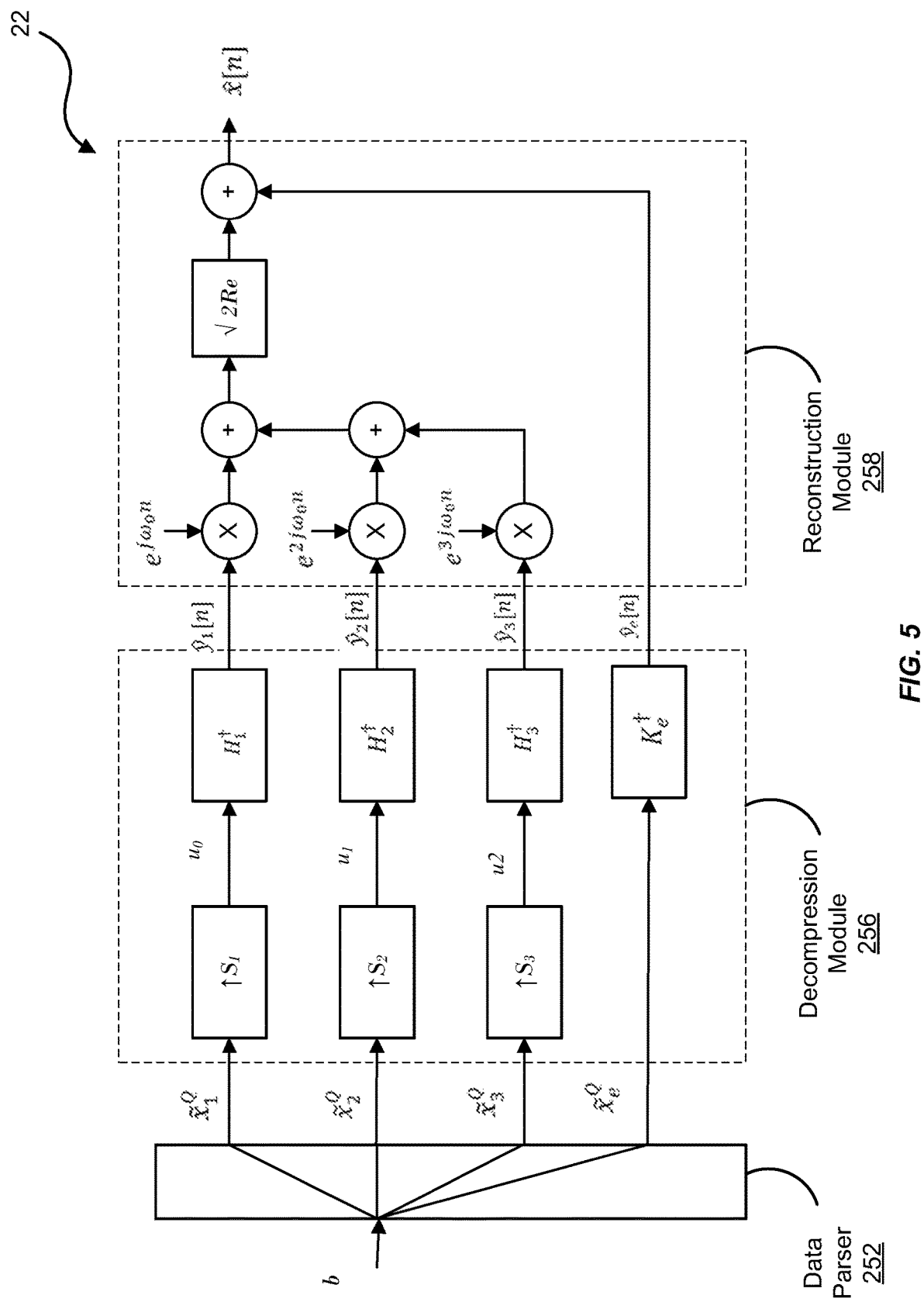
FIG. 5 is a block diagram of an exemplary ASBC decoder.

Once received by the control center 20, the ASBC decoder 22 may demodulate/reconstruct the PMU data of the ASBC encoders 14. In this regard, the ASBC decoder 22 is now presented in FIG. 5. In this embodiment, the ASBC decoder 22 is configured with a data parser 252, a decompression module 256, and a reconstruction module 258. The data parser 252 may be configured to parse the single bitstream from the data concentrator 18 into subband streams $\hat{x}_k^Q$ according to their individual harmonics. The data stream $\hat{x}_k^Q$ may differ somewhat from the data stream $x_k^Q$ of the ASBC encoder 14 due to quantization errors that are commonly introduced by the $Q_k$ elements of the modulator 156 of the ASBC encoder 14.

The decompression module 256 may receive a parsed data sequence $\hat{x}_k^Q[n]$ and up sample the data sequence by $M_k$ fold to produce $\hat{x}_k$ by inserting zeros in places where no value symbols "#" are located. More specifically, the decompression module 256 ignores the quantization error by considering that $\hat{x}_k[n]$ is $x_k[n]$ with "no value" symbols being replaced by zeros. The up sampled data sequence $\hat{x}[n]$ is then passed through a subband filter $\hat{H}_k(z)$ to produce an estimate of the baseband representation of the harmonic signal $y_k[n]$. An interpolation filter may be chosen as a matched filter that matches H to enhance the signal-to-noise ratio. However, other implementations such as an ideal low-pass filter may also be used. And, once the data sequence $\hat{x}_k^Q[n]$ has been demodulated/decompressed, the reconstruction module 258 of the ASBC decoder 22 operates on the subband signals $\hat{y}_k[n]$ to produce an estimate of the original direct sampled x[n] of x(t) in the ASBC encoder 14 as:

$$\hat{x}[n] = \sqrt{2}\,\text{Re}\left(\sum_{k=1}^{K}\hat{y}_k[n]e^{jk\omega_0 n}\right) + \hat{y}_e[n].$$

Figure 6:
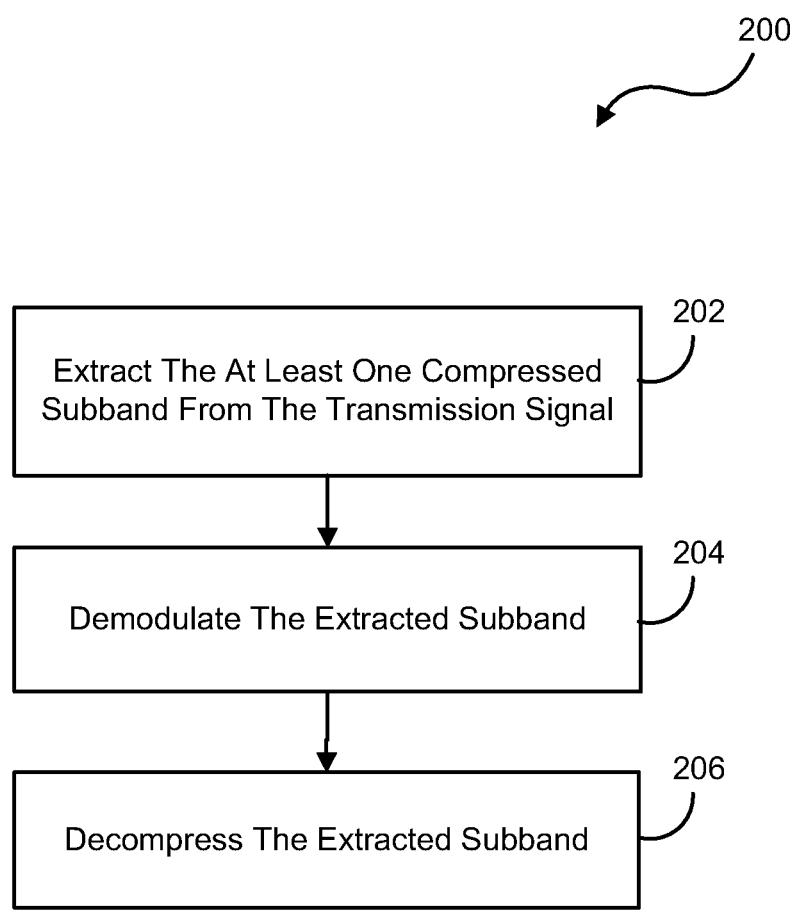
FIG. 6 is a flowchart of an exemplary process of the ASBC decoder.

Based on the foregoing, FIG. 6 is a flowchart of an exemplary process 200 of the ASBC decoder 22. In this embodiment, the ASBC decoder 22 receives a transmission signal from the data concentrator 18 that includes a data stream of the subbands that were selectively compressed and transmitted to the data concentrator 18. The ASBC decoder 22 first extracts individual subbands (e.g., at least one compressed subband), in the process element 202. The ASBC decoder 22 then demodulates the extracted subband, in the process element 204. From there, the ASBC decoder 22 decompresses the extracted subband, in the process element 206, for forwarding to the processor 24 for analysis. For example, the processor 24 may convert the decompressed and digitized subband into a frequency domain for analysis of the activity in the subband of its associated power signal 16.

The ASBC encoder 14/decoder 22 embodiments herein are operable to apply a direct compression of phasor and frequency measurements operable within existing communication infrastructures of the power system. For example, voltage/current phasor and frequency estimates may be produced locally by the remote sensors 12. Thus, assuming that phasor frequency estimation algorithms already taking into account higher order harmonics, the problem of compression simplifies to a single subband compression problem. The encoders 14 of the remote sensors 12 generally only implement the subband filters $H_0(z)$ without frequency downshifting, as illustrated in FIG. 3. The output $y_0[n]$ of $H_0(z)$ is down sampled by $S_k$ fold, quantized to $x_0^Q[n]$, and then converted to a single channel bitstream b.

In some embodiments, certain design parameters and performance of ASBC encoder 14/decoder 22 are selectable. For example, in the ASBC encoder 14, each subband may be considered separately. The parameters for the subband encoder that compresses the harmonic include the down sampling rate $S_k$ and the per sample quantization rate $B_k$ in bits per sample. These two parameters can be chosen independently or jointly. For the PCM quantization scheme, the down sampling rate $S_k$ may be configured as $F_s/S_k \geq W_k$, where $W_k$ is the bandwidth of $x_k(t)$. And, the quantization rate $B_k$ may be configured such that the quantization error satisfies some pre-determined error criterion. Then, the total vector error (TVE) for a complex measurement of x[n] may be represented as:

$$TVE := \sqrt{\frac{|x^Q[n] - x[n]|^2}{|x[n]|^2}} \approx \frac{1}{\sqrt{SNR}},$$

where SNR is the signal to quantization noise ratio of the PCM. Thus, measured in decibels (dB), $TVE_{dB} \approx -SNR_{dB}$. The SNR in dB for the PCM with $B_k$ bits may be given as $SNR_{dB} = 1.76 + 6B_k$. For the 1% TVE required by the Institute for Electrical and Electronic Engineers (IEEE) standard C 37.118.1, the number of bits required for the PCM is given by $10\log_{10} 0.01 \approx -1.76 - 6B_k \Rightarrow B_k \approx 3.04$ (bits/sample). Assuming that the bandwidth of the $k^{th}$ harmonics is $W_k$ Hz, setting $S_k = F_s/W_k$ (e.g., the average bit rate that the subband encoder is given by $R_h = W_k B_k \Pr(z_k[(n \bmod M_k)] = 1)$, where $\Pr(z_k[(n \bmod M_k)] = 1)$ is the probability that a block of $M_k$ data samples of the harmonic is detected to be active. For example, if $W_k \approx 3$ Hz, $B_k = 4$ bits per sample, and $\Pr(z_k[(n \bmod M_k)]) = 1$, $R_k = 12$ bits per second. Then, if the total number of higher order harmonics is present and under 1% of the TVE requirement and signal bandwidth $W_0$ is 3 Hz, the bit rate of the ABSC encoder 14 may be given as $R^{ASBC} = W_D B_0 \approx 12$ (bits/sec). In comparison, under the current frame rate of 120 Hz, the PMU measurement, without higher order harmonics using the same PCM quantization is 480 bits per second. Accordingly, the ABSC embodiments presented herein achieve an approximate compression ratio of 40. And, under the same 120 Hz frame rate used under the current standard, the ABSC embodiments enable communication of measurements that include up to 39 active harmonics.

Exemplary empirical results of the ABSC embodiments are now presented. First, a compression of high-density data from direct voltage measurements at a sampling rate of Fs=6 Hz is illustrated. For example, without compression, communication of this data stream to the control center 20 generally require an 18 kbps (kilobits per second) link for a single channel, assuming a three bit PCM quantization. Then, the application of the ABSC embodiments to direct PMU voltage and frequency measurements is illustrated.

The standard performance measure for lossy compression is the rate distortion curve that plots the signal reconstruction error (e.g., typically measured by mean squared error) versus the rate of compressed signal. In this regard, the standard TVE on individual samples may be generalized to one for finite duration data streams. With the generalized TVE (G-TVE), the accuracy of the reconstructed data stream of length N may be measured by $$G\text{-}TVE = 10\log_{10}\frac{\sum_{n=1}^{N}|x[n] - \hat{x}[n]|^2}{\sum_{n=1}^{N}x^2[n]}\,(\text{dB}),$$

where x[n] and $\hat{x}_k[n]$ represent the original and reconstructed signal, respectively. Measured in decibels, the G-TVE also has the interpretation to be the negative of signal to reconstruction noise ratio (SNR). And, the G-TVE reduces to the TVE when N=1.

The degree of compression may be measured by the compression ratio, which is defined as the ratio of uncompressed data rate $R^{uncoded}$ and the compressed data rate $R^{SBC}$. These data rates may be calculated as $R^{uncoded} = F_s R_0$ and $$R^{SBC} = F_s\sum_{k=0}^{K}p_k\frac{R_k}{M_k},$$

where Fs is the sampling rate of the uncompressed data, $R_k$ is the quantization for the $k^{th}$ subband, $p_k$ is the probability of the $k^{th}$ subband being active, and $M_k$ is the down sampling rate of the $k^{th}$ subband. When the same quantization scheme is used for all subbands, the compression ratio may be given as $$\eta = \frac{R_0}{R_k} = \left(\sum_{k=0}^{K}p_k\frac{R_k}{R_0 M_k}\right)^{-1}.$$

In highlighting the trade-off between compression rate and reconstruction error, the information theoretic measure for lossy compression is generally the rate distortion that plots the rate of compression against the reconstruction error. For convenience, the inverse rate distortion plot is used to show the change of reconstruction error measured by the NMSE or TVE with the inverse compression ratio $\eta^{-1}$.

Figure 7:
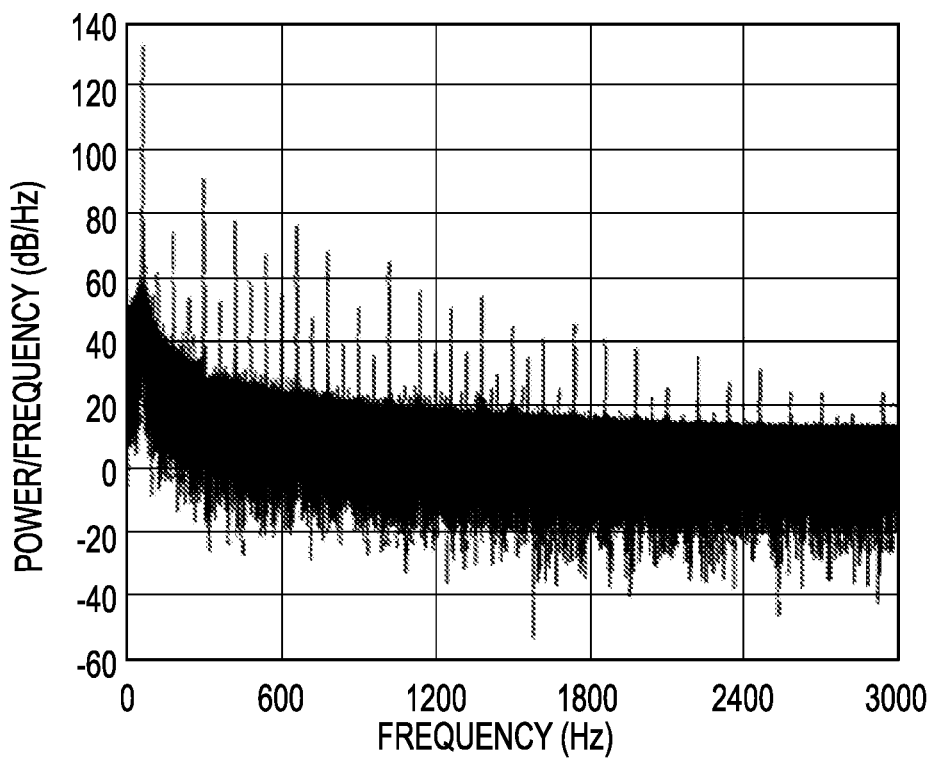
FIG. 7 illustrates a power spectrum showing the presence of observed harmonics.

To illustrate the compression of direct voltage measurements, the ASBC embodiments were directly applied to a dataset comprising 1.8 million voltage measurements sampled at 6 kHz. FIG. 7 illustrates the power spectrum of the dataset from which the presence of significant harmonics was observed.

Figure 8:
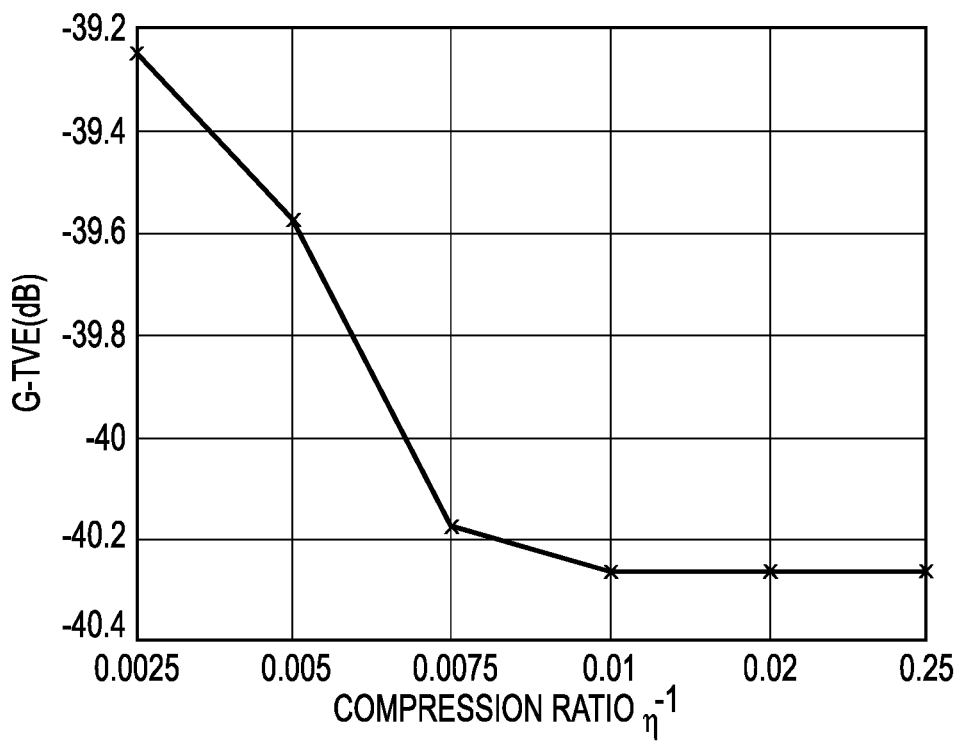
FIG. 8 illustrates an exemplary inverse rate distortion of the ASBC embodiments in which 20 harmonics of subbands were accurately produced during reconstruction.

The ASBC embodiments were implemented with a 3 Hz bandwidth for all harmonics and encoded 5, 10, 15, 20, 40, and 50 subbands. FIG. 8 illustrates the inverse rate distortion of the ASBC embodiments, which shows that encoding the 20 harmonics of bands produced sufficient accuracy during reconstruction. It should be noted that the bandwidth of each subband used in the experiment was uniform, and a better compression ratio may have been achieved by adaptively choosing the bandwidth for each subband.

Figure 9:
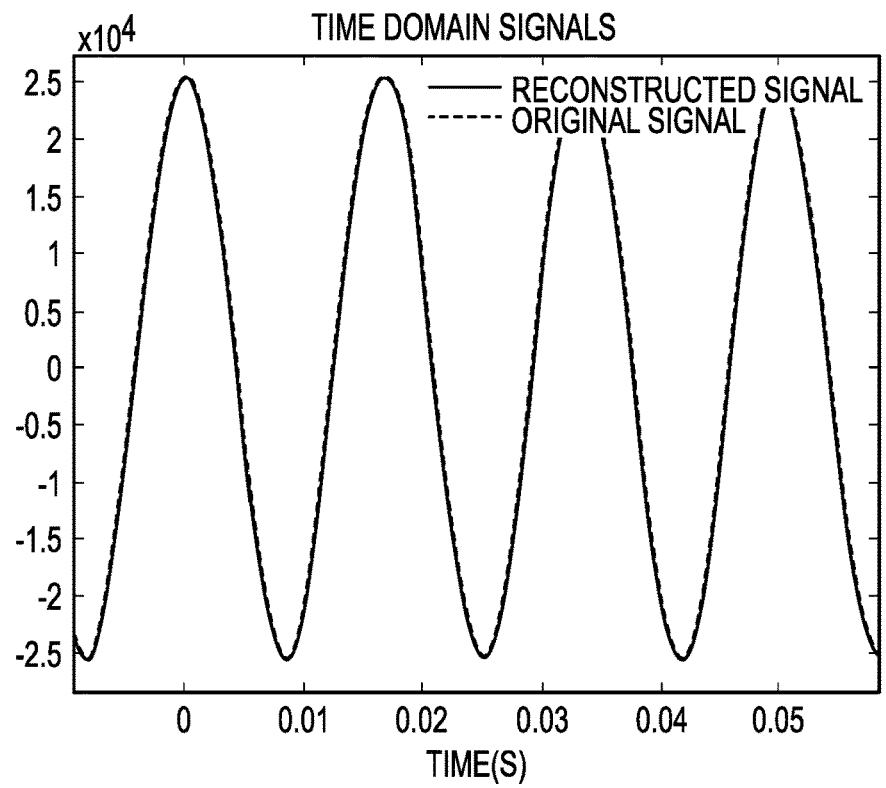
FIG. 9 illustrates one exemplary segment of original and reconstructed signals.
Figure 10:
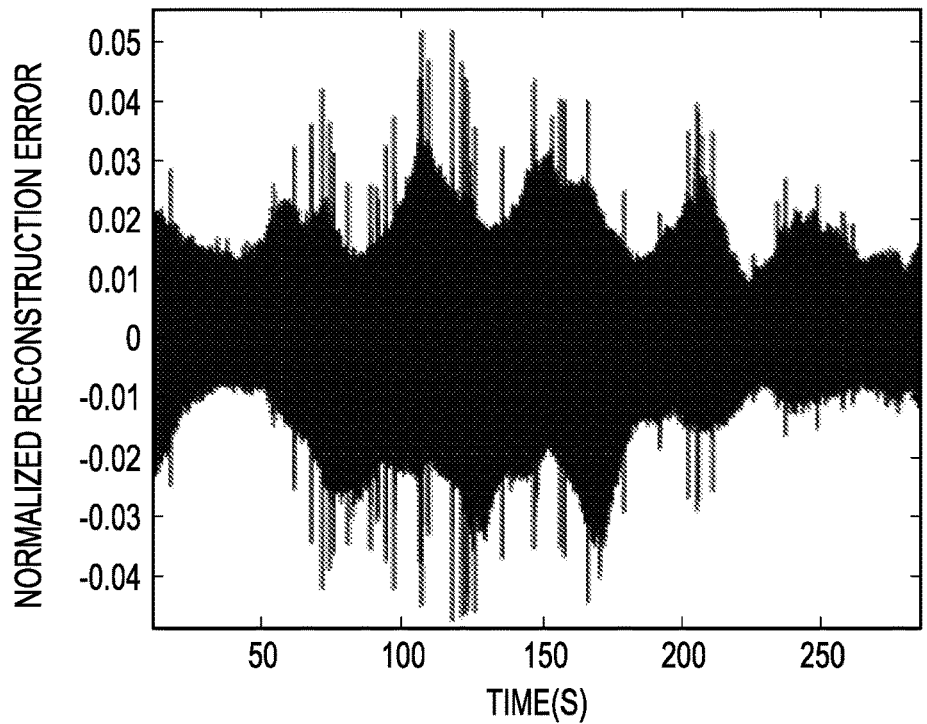
FIG. 10 illustrates an exemplary normalized reconstruction error in the time domain.

FIG. 9 illustrates one segment of the original and the reconstructed signals. The trajectory is plotted with the first 20 subbands being active, each with a 5 Hz bandwidth, where the ASBC embodiments were shown to reconstruct the original signal with negligible reconstruction error from the compressed signal having a high compression ratio. FIG. 10 illustrates the normalized reconstruction error in the time domain.

Next the compression of the voltage phasor and frequency data by the ASBC embodiments is presented. The ASBC embodiments were applied to two data sets consisting of PMU phasor and frequency measurements. The first dataset included a synchronphasor measurement of a distribution system. The dataset comprised 10 data streams, each containing 180,000 voltage phasor measurements at a 50 Hz frame rate. Some of the data streams had significant voltage fluctuations. The second dataset comprised frequency estimates containing two data streams, each with 1.8 million samples. For each of the datasets, since there was no higher order harmonics, only one subband (e.g., k=0) was used in the ASBC embodiments.

Figures 11, 12:
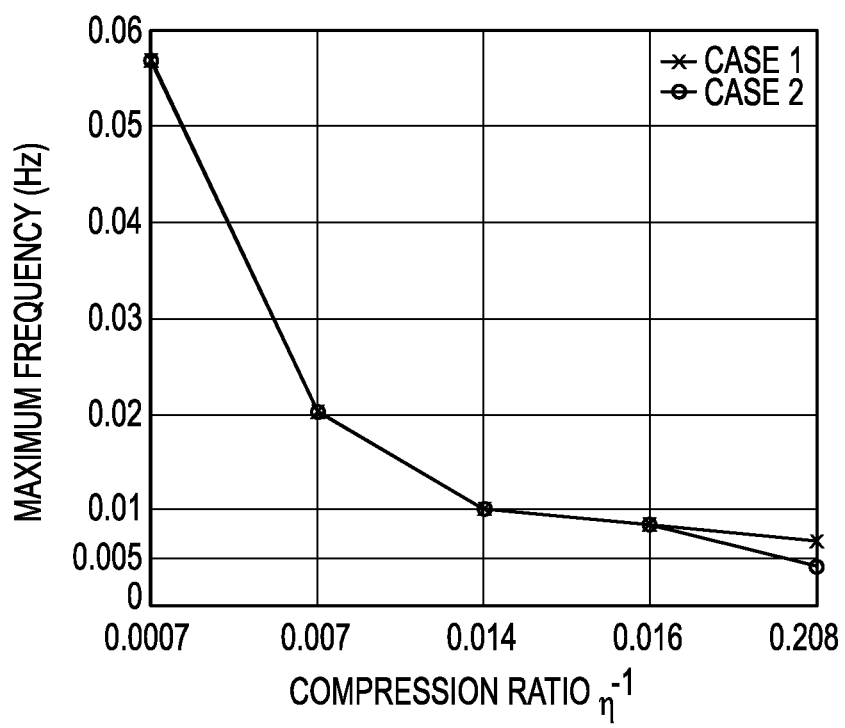
FIG. 11 shows the maximum total vector error (TVE) of 10 data streams at a 50:1 compression ratio.
FIG. 12 is a graph that illustrates an exemplary inverse rate distortion ratio of the maximum frequency error against the compression ratio.

The table illustrated in FIG. 11 shows the maximum TVE of the 10 data streams of the first dataset at a 50:1 compression ratio. It can be observed that the maximum TVE for a majority of the cases was under 1%, satisfying the requirement of the current industry standard.

Figure 13:
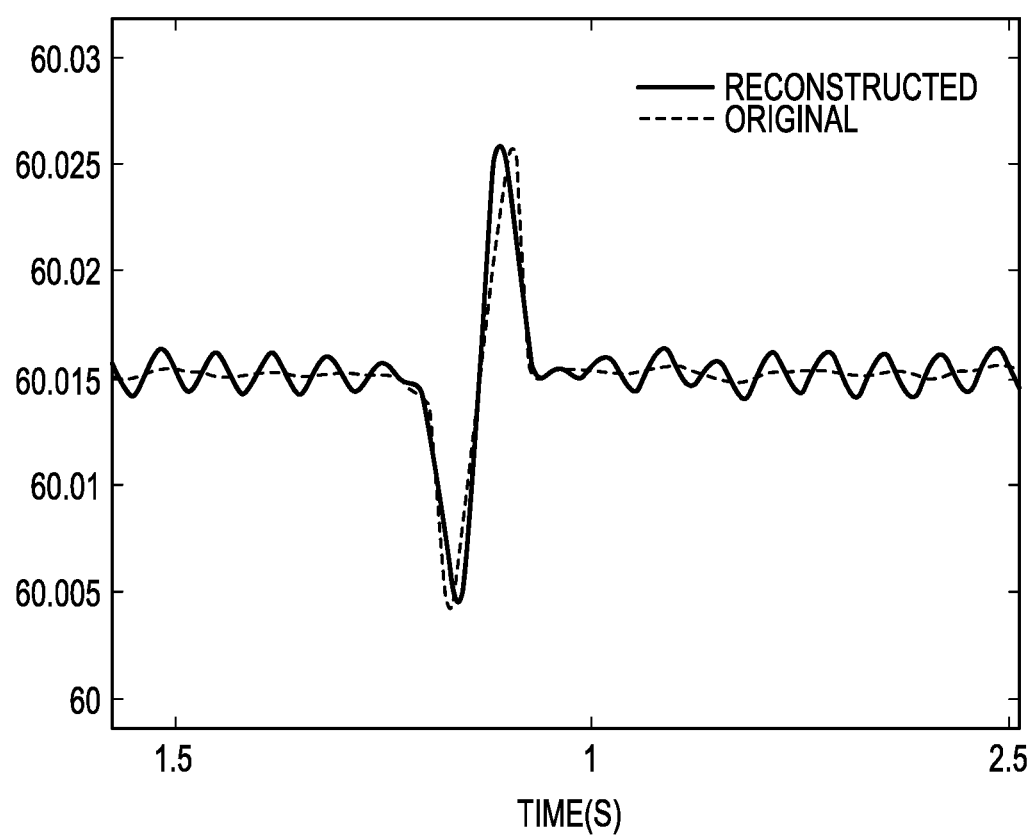
FIG. 13 illustrates an exemplary trajectory of a frequency measurement and its reconstruction during a frequency excursion event.

FIG. 12 is a graph that illustrates the inverse rate distortion ratio that shows the maximum frequency error against the compression ratio. The subband filter bandwidth was chosen to be 1 Hz, 10 Hz, 20 Hz, and 24 Hz. The maximum frequency reconstruction error was obtained during a frequency excursion. The 24 Hz bandwidth subband compression satisfied the IEEE standard C.71 dynamic compliance that requires that the maximum frequency error be below 0.01 Hz for a P class PMU with a reporting rate smaller than 20 Hz. And, FIG. 13 presents a trajectory of the frequency measurement and its reconstruction during a frequency excursion event. The reconstructed signal was oscillating slightly before the deviation began due to a windowing effect.

In summary, ASBC embodiments herein provide for the streaming of measurement data of a wide area measurement system. The ASBC embodiments employ a filter bank that decomposes measurements based on the harmonic structure of the signal waveforms and adaptively compresses individual harmonic components. The ASBC embodiments provide a significantly improved rate distortion trade-off performance.

Figure 14:
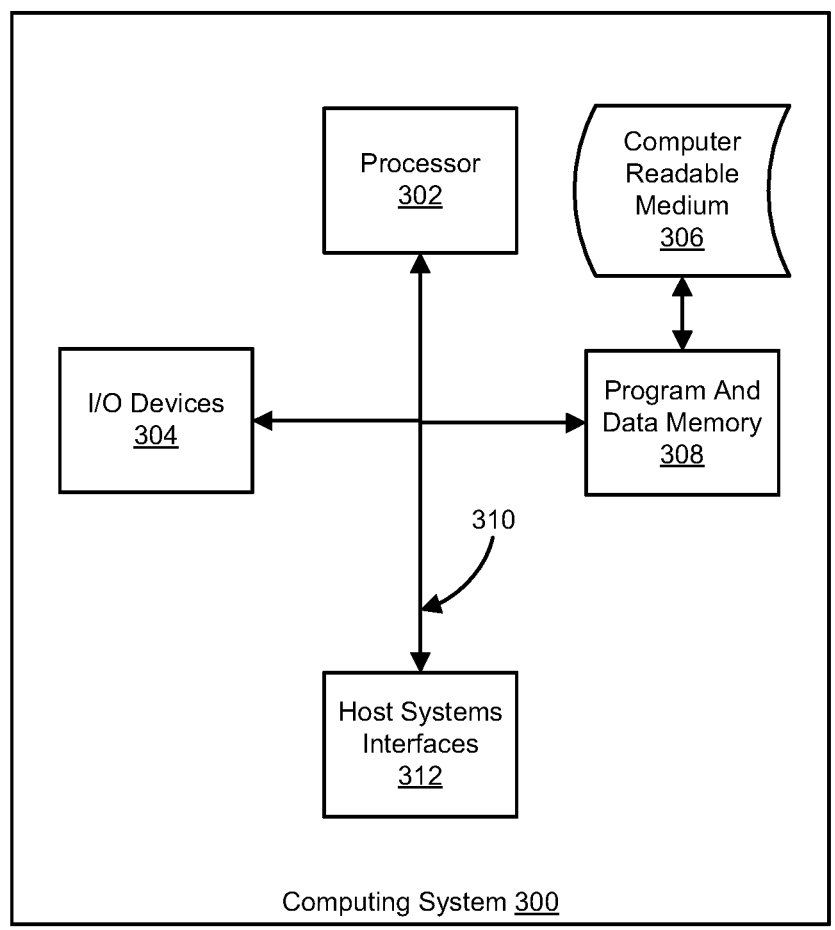
FIG. 14 is a block diagram of an exemplary computing system in which a computer readable medium provides instructions for performing methods herein.

Any of the above embodiments herein may be rearranged and/or combined with other embodiments. Accordingly, the ASBC concepts herein are not to be limited to any particular embodiment disclosed herein. Additionally, the embodiments can take the form of entirely hardware or comprising both hardware and software elements. Portions of the embodiments may be implemented in software, which includes but is not limited to firmware, resident software, microcode, etc. FIG. 14 illustrates a computing system 300 in which a computer readable medium 306 may provide instructions for performing any of the methods disclosed herein.

Furthermore, the embodiments can take the form of a computer program product accessible from the computer readable medium 306 providing program code for use by or in connection with a computer or any instruction execution system. For the purposes of this description, the computer readable medium 306 can be any apparatus that can tangibly store the program for use by or in connection with the instruction execution system, apparatus, or device, including the computer system 300.

The medium 306 can be any tangible electronic, magnetic, optical, electromagnetic, infrared, or semiconductor system (or apparatus or device). Examples of a computer readable medium 306 include a semiconductor or solid state memory, magnetic tape, a removable computer diskette, a random access memory (RAM), NAND flash memory, a read-only memory (ROM), a rigid magnetic disk and an optical disk. Some examples of optical disks include compact disk-read only memory (CD-ROM), compact disk-read/write (CD-R/W) and digital versatile disc (DVD).

The computing system 300, suitable for storing and/or executing program code, can include one or more processors 302 coupled directly or indirectly to memory 308 through a system bus 310. The memory 308 can include local memory employed during actual execution of the program code, bulk storage, and cache memories which provide temporary storage of at least some program code in order to reduce the number of times code is retrieved from bulk storage during execution. Input/output or I/O devices 304 (including but not limited to keyboards, displays, pointing devices, etc.) can be coupled to the system either directly or through intervening I/O controllers. Network adapters may also be coupled to the system to enable the computing system 300 to become coupled to other data processing systems, such as through host systems interfaces 312, or remote printers or storage devices through intervening private or public networks. Modems, cable modem and Ethernet cards are just a few of the currently available types of network adapters.

What is claimed is:

1. A system for adaptive subband compression of power signals in a power system, comprising:
   an encoder operable to partition sensor measurements into a plurality of digitized subbands with center frequencies at integer multiples of a fundamental frequency of a phasor signal, to detect activity in at least one of the digitized subbands, and to compress the at least one digitized subband with the detected activity; and
   a data concentrator operable to transmit the at least one compressed subband to a processor for analysis.

2. The system of claim 1, wherein:
   another encoder operable to partition other sensor measurements into another plurality of digitized subbands with center frequencies at integer multiples of the fundamental frequency of the phasor signal, to detect activity in at least one of the other digitized subbands, and to compress the at least one other digitized subband with the detected activity, wherein the data concentrator is further operable to combine the fundamental frequency of the phasor signal with the digitized subbands that comprise the detected activity into a transmission signal, and to transmit the transmission signal to the processor for analysis.

3. The system of claim 2, wherein:
the transmission signal is one or more of a pulse code modulated (PCM) signal, a differential PCM signal, or a Sigma Delta modulated signal, or a vector quantizer, or a machine learning-based quantizer signal.

4. The system of claim 1, wherein:
at least two of the subbands comprise different bandwidths.

5. The system of claim 4, wherein:
the encoder is further operable to digitize at least two of the subbands at different sampling rates.

6. The system of claim 1, wherein:
the encoder is further operable to detect the activity in the at least one digitized subband by comparing the at least one digitized subband to a threshold.

7. The system of claim 6, wherein:
the threshold is operable to remove remaining subbands from being compressed and transmitted to the processor.

8. The system of claim 1, further comprising:
a decoder operable to extract the at least one compressed subband, to demodulate the at least one compressed subband, and to decompress the at least one compressed subband.

9. The system of claim 8, wherein the processor is further operable to transform at least one decompressed subband into a frequency domain for analysis.

10. The system of claim 1, wherein:
the processor is operable to control at least a portion of the power system based on the detected activity in at least one digitized subband.

11. A method of adaptive subband compression of power signals in a power system, comprising:
with an encoder:
partitioning sensor measurements into a plurality of digitized subbands with center frequencies at integer multiples of a fundamental frequency of a phasor signal;
detecting activity in at least one of the digitized subbands; and
compressing the at least one digitized subband with the detected activity; and
transmitting the at least one compressed subband to a processor for analysis.

12. The method of claim 11, wherein:
with another encoder:
partitioning other sensor measurements into another plurality of digitized subbands with center frequencies at integer multiples of the fundamental frequency of the phasor signal;
detecting activity in at least one of the other digitized subbands; and
compressing the at least one other digitized subband with the detected activity;
combining the fundamental frequency of the phasor signal with the digitized subbands that comprise the detected activity into a transmission signal; and
transmitting the transmission signal to the processor for analysis.

13. The method of claim 12, wherein:
the transmission signal is one or more of a pulse code modulated (PCM) signal, a differential PCM signal, or a Sigma Delta modulated signal, or a vector quantizer, or a machine learning-based quantizer signal.

14. The method of claim 11, wherein:
at least two of the subbands comprise different bandwidths.

15. The method of claim 14, further comprising:
digitizing at least two of the subbands at different sampling rates.

16. The method of claim 11, further comprising:
detecting the activity in the at least one digitized subband by comparing the at least one digitized subband to a threshold.

17. The method of claim 16, wherein:
the threshold is operable to remove remaining subbands from being compressed and transmitted to the processor.

18. The method of claim 11, further comprising:
extracting the at least one compressed subband;
demodulating the at least one compressed subband; and
decompressing the at least one compressed subband.

19. The method of claim 18, further comprising:
transforming at least one decompressed subband into a frequency domain for analysis.

20. The method of claim 11, further comprising:
controlling at least a portion of the power system based on the detected activity in at least one digitized subband.

21. A non-transitory computer readable medium comprising instructions that, when executed by one or more processors in a power system, direct the one or more processors to:
partition sensor measurements into a plurality of digitized subbands with center frequencies at integer multiples of a fundamental frequency of a phasor signal;
detect activity in at least one of the digitized subbands;
compress the at least one digitized subband with the detected activity; and
transmit the at least one compressed subband to another processor for analysis.

22. The computer readable medium of claim 21, further comprising instructions that direct the one or more processors to:
partition other sensor measurements into another plurality of digitized subbands with center frequencies at integer multiples of the fundamental frequency of the phasor signal;
detect activity in at least one of the other digitized subbands;
compress the at least one other digitized subband with the detected activity;
combine the fundamental frequency of the phasor signal with the digitized subbands that comprise the detected activity into a transmission signal; and
transmit the transmission signal to the other processor for analysis.

23. The computer readable medium of claim 22, wherein:
the transmission signal is one or more of a pulse code modulated (PCM) signal, a differential PCM signal, or a Sigma Delta modulated signal, or a vector quantizer, or a machine learning-based quantizer signal.

24. The computer readable medium of claim 21, wherein:
at least two of the subbands comprise different bandwidths.

25. The computer readable medium of claim 24, further comprising instructions that direct the one or more processors to:
digitize at least two of the subbands at different sampling rates.

26. The computer readable medium of claim 21, further comprising instructions that direct the one or more processors to:
detect the activity in the at least one digitized subband by comparing the at least one digitized subband to a threshold.

27. The computer readable medium of claim 26, wherein:
the threshold is operable to remove remaining subbands from being compressed and transmitted to the other processor.

28. The computer readable medium of claim 21, further comprising instructions that direct the processors to:
extract the at least one compressed subband;
demodulate the at least one compressed subband; and
decompress the at least one compressed subband.

29. The computer readable medium of claim 28, further comprising instructions that direct the one or more processors to:
transform at least one decompressed subband into a frequency domain for analysis.

30. The computer readable medium of claim 21, further comprising instructions that direct the one or more processors to:
control at least a portion of the power system based on the detected activity in at least one digitized subband.

\* \* \* \* \*